United States Patent

Matsushita et al.

[11] 4,062,034
[45] Dec. 6, 1977

[54] SEMICONDUCTOR DEVICE HAVING A HETERO JUNCTION

[75] Inventors: Takeshi Matsushita, Sagamihara; Hisao Hayashi, Atsugi; Mitsuru Shibasaki, Hatano, all of Japan

[73] Assignee: Sony Corporation, Tokyo, Japan

[21] Appl. No.: 679,846

[22] Filed: Apr. 23, 1976

[30] Foreign Application Priority Data

Apr. 30, 1975 Japan .................. 50-52731

[51] Int. Cl.² .......................................... H01L 29/161
[52] U.S. Cl. ..................................... 357/16; 357/59; 357/63; 357/64
[58] Field of Search ..................... 357/16, 59, 63, 64

[56] References Cited

U.S. PATENT DOCUMENTS

| | | | |
|---|---|---|---|
| 3,460,007 | 8/1969 | Scott | 317/235 |
| 3,570,114 | 3/1971 | Bean | 29/577 |
| 3,611,070 | 10/1971 | Engeles | 317/235 |
| 3,664,896 | 5/1972 | Duncan | 148/187 |
| 3,726,719 | 4/1973 | Broch | 357/59 |
| 3,961,997 | 6/1976 | Chu | 148/174 |
| 3,977,019 | 8/1976 | Matsushita | 357/48 |
| 3,990,100 | 11/1976 | Mamine et al. | 357/30 |

OTHER PUBLICATIONS

Brodsky et al., Phys. Stat. Sol. (b), 72, 761, 1975, pp. 761-770.
Busmundrud, Phys. Stat. Sol. (a) 28, 255 (1975).

Primary Examiner—Martin H. Edlow
Attorney, Agent, or Firm—Hill, Gross, Van Santen, Steadman, Chiara & Simpson

[57] ABSTRACT

A semiconductor device comprising a silicon substrate with an oxygen doped polycrystalline or amorphous silicon layer formed on the substrate so as to form a hetero junction therewith. A transistor formed according to the invention has an emitter-base hetero junction and has a high current gain.

9 Claims, 16 Drawing Figures

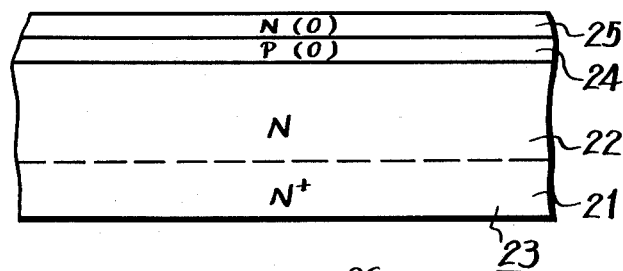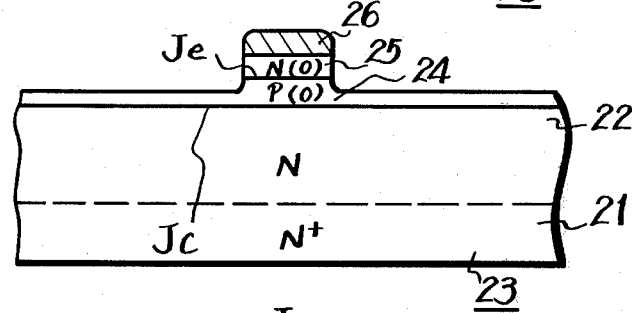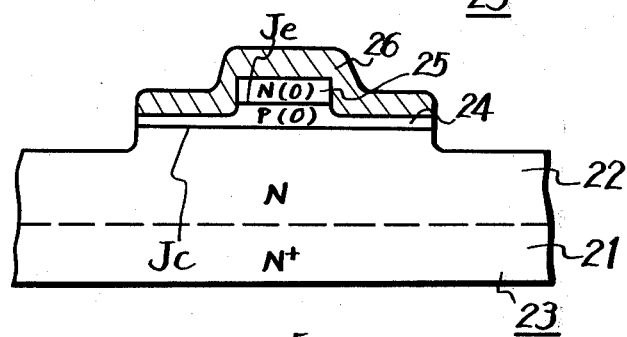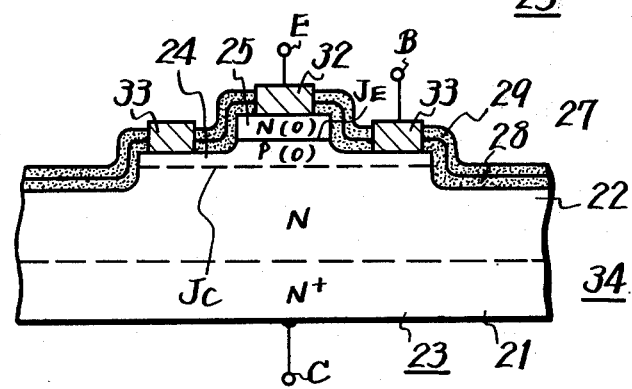

SEMICONDUCTOR DEVICE HAVING A HETERO JUNCTION

BACKGROUND OF THE INVENTION

1. Field of the Invention

This invention relates in general to a semiconductor device and especially to a transistor having a hetero junction.

2. Description of Prior Art

Transistors having a wide gap emitter are known in which the band gap energy width of the emitter is larger than that of the base and there is a hetero junction between an emitter-base junction. In such transistors the minority carrier current in the emitter can be sufficiently small even if the impurity concentration in the base is greater than $10^{19}$ atoms/cm$^3$ order of magnitude because of the band gap difference at the emitter-base junction. This results in the emitter junction efficiency $\gamma$, approaching unity and the current gain (emitter-grounded) $h_{FE}$ is large.

Materials for forming a hetero junction must be such that the differences of lattice constant and the thermal expansion coefficient are very small. The combinations of Ga As-Ge or Ga Al As - GaAs are known.

SUMMARY OF THE INVENTION

The object of the present invention is to provide an improved hetero junction by employing polycrystalline or amorphous silicon containing oxygen.

The inventors have discovered that the band gap width of silicon increases and approaches that of silicon dioxide as the oxygen concentration increases. Such discovery was made by opticlly observing. A high grade hetero junction is formed between silicon and oxygen doped polycrystalline or amorphous silicon in the present invention.

Other objects, features and advantages of the invention will be readily apparent from the following description of certain preferred embodiments thereof taken in conjunction with accompanying drawings although variations and modifications may be effected without departing from the spirit and scope of the novel concepts of the disclosure, and in which

BRIEF DESCRIPTION OF THE DRAWINGS

FIGS. 7A to 7D illustrate the method of constructing a second embodiment of the invention;

DESCRIPTION OF THE PREFERRED EMBODIMENTS

Figure 1:
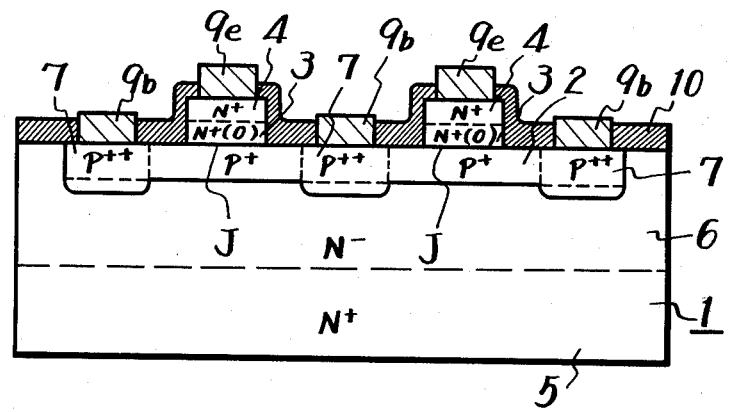
FIG. 1 is a sectional view illustrating a first embodiment of the invention.

FIGS. 1, 2 and FIGS. 3A through 3D illustrate a first embodiment of the invention applied to a transistor having a wide gap emitter.

A p+ base region 2 is formed by diffusion with an impurity concentration more than $10^{19}$ atoms/cm$^3$ in an N type silicon substrate 1 to form a collector 6. A polycrystalline or amorphous silicon layer 3 containing oxygen and N impurity is deposited on the region 2. On top of layer 3 is deposited the polycrystalline or amorphous silicon layer 4 without oxygen but containing N+ type impurity. Emitter and base electrodes 9e and 9b are deposited on the silicon layer 3 and a P++ type base region 7. If the electrode 9e is made of aluminum, the layer 4 is required. However, if Cr-Au alloy is used as the electrode 9e, the layer 4 can be eliminated because this alloy can make good contact to the layer 3.

The silicon layer 3 is the emitter and there is a hetero junction J between the base 2 and the emitter 3. A silicon dioxide layer 10 covers the substrate 1. The emitter and base electrodes 9e and 9b are comb-shaped as illustrated in the plan view of FIG. 2.

Figure 2:
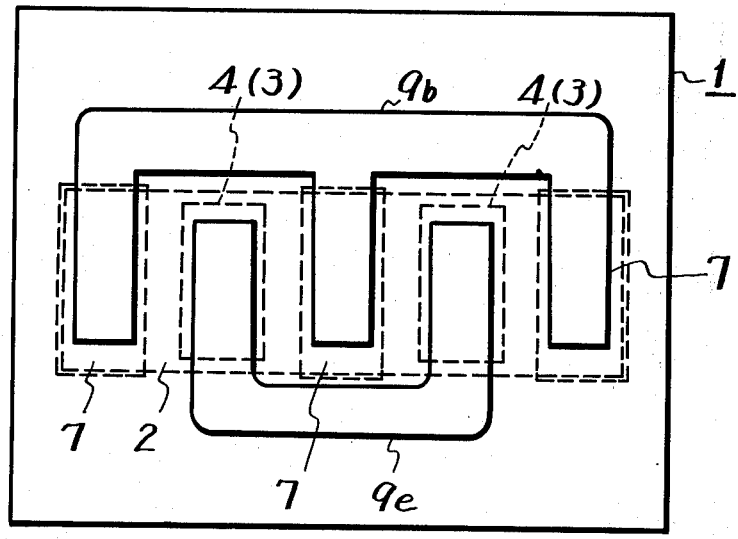
FIG. 2 is a top plan view illustrating the invention.

FIGS. 3A through 3D illustrate a method of manufacturing the transistor shown in FIGS. 1 and 2. The base 2 is formed in the N− collector 6 and has P+ type impurity of concentration of $10^{19}$ to $10^{20}$/cm$^3$ order. The P++ type region 7 illustrated in FIG. 1 can be diffused before the diffusion of the region 2 and serves as the base region.

Figure 3A:
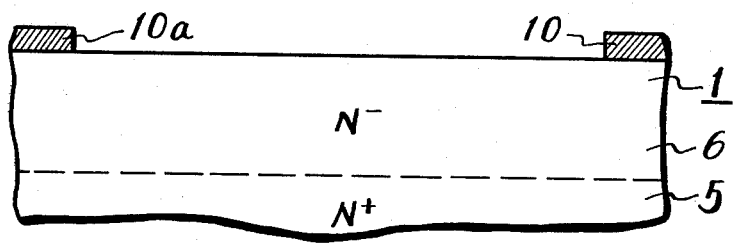
FIGS. 3A to 3D are sectional views illustrating the method of constructing the invention.
Figure 3B:
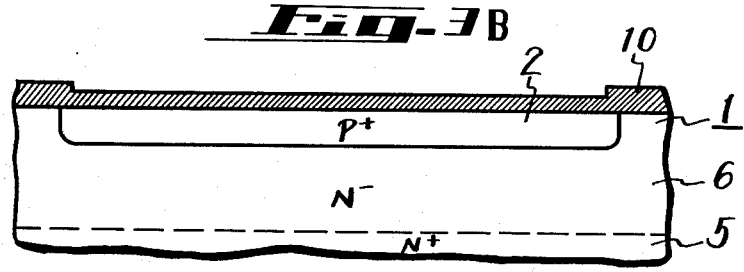
Figure 3C:
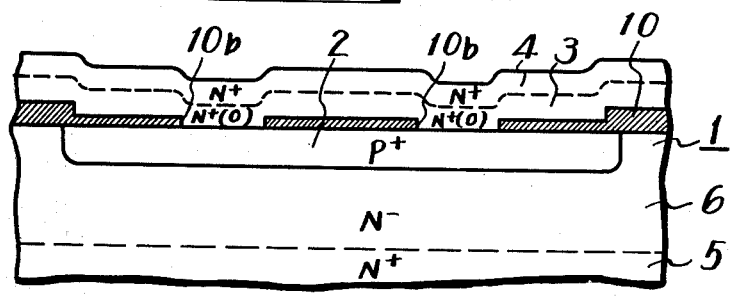
Figure 3D:
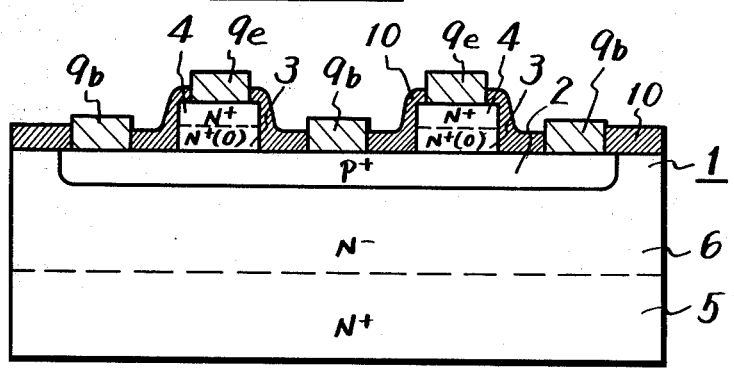

The layer 3 contains oxygen and phosphor of $1^{20}$ atoms/cm$^3$ order. It has a thickness in the range of 1000 A to 10,000 A, as for example, 5000 A. The layer 4 has a thickness of 5000 A, as illustrated in FIG. 3C.

The oxygen doping in the slicon layer 3 is such that the band gap thereof is larger than that of the silicon 2 by more than 0.2eV. The oxygen concentration is desirably more than 15 atomic percent.

Figure 4:
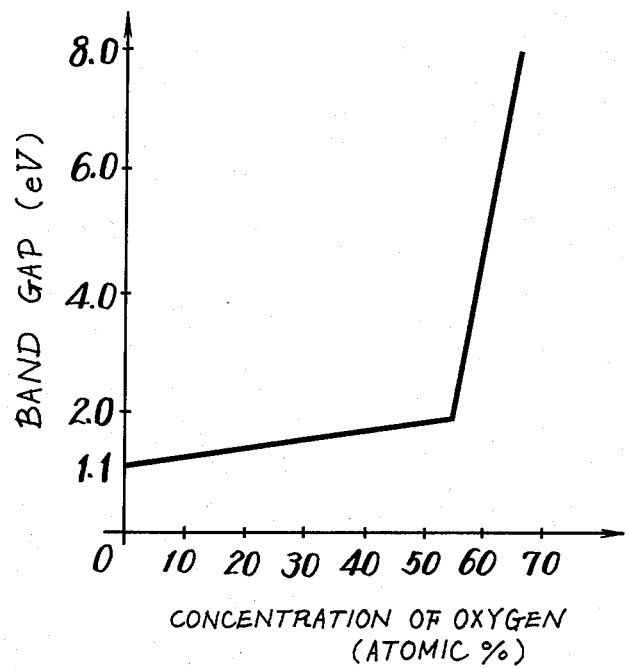
FIG. 4 is a plot of oxygen concentration in silicon versus the band gap energy characteristic.

FIG. 4 illustrates the oxygen concentration in the silicon versus its band gap. The band gap approaches that of silicon dioxide as the oxygen concentration increases.

The oxygen doped silicon layer 3 has an average silicon grain size of 50 A to 100 A. If it is less than 50 A, its characteristic approaches that of silicon dioxide, and it will have a memory effect. It also requires a low reaction temperature and low growth rate which is not productive. It it is more than 1000 A, the leakage current increases.

Figure 5:
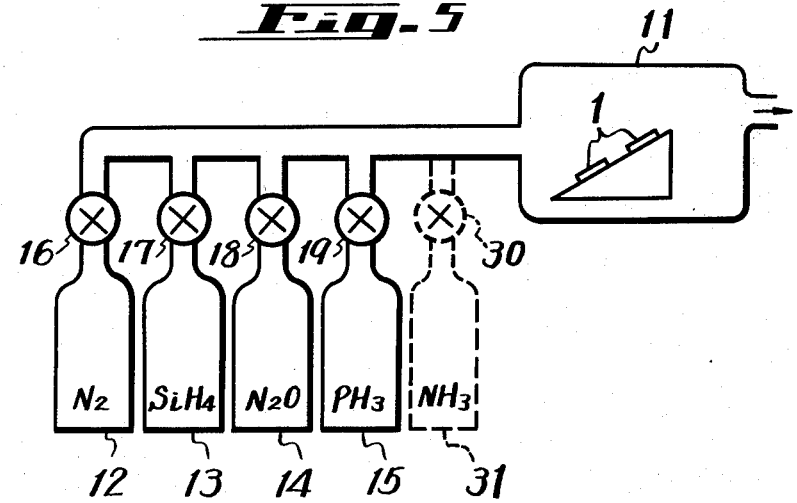
FIG. 5 illustrates an apparatus for manufacturing devices according to the invention.

FIG. 5 illustrates a chemical vapor deposition system for obtaining oxygen doped silicon. A reactor 11 is connected to a carrier source $N_2$, 12, through a valve 16 and to a silicon source $SiH_4$, 13, through a valve 17. The reactor 11 is also connected to an oxygen source ($N_2O$,NO or $NO_2$) through a valve 18 and an impurity source ($PH_3$, $AsH_3$, $B_2H_6+CO_2$ or $AlCl_3$) 15 through a valve 19. The substrate 1 is placed into the reactor 11 and is heated to the range between 600 to 750° C, for example, 650° C. Monosilane $SiH_4$ is used as the silicon source because it produces a desirable silicon grain size at a relatively low temperature as for example, 650° C. If $SiCl_4$ is used, a reaction temperature such as 900° C is required which results in the grain size being too large and too fast a growth rate which is very difficult to control.

The oxygen concentration is controlled by controlling the flow rate of $N_2O$ to $SiH_4$. The following table shows this relationship. The silicon layers 3 and 4 are continuously formed.

| $\frac{N_2O}{SiH_4}$ | Oxygen Concentration Atomic % | Eg(eV) |
|---|---|---|
| 0 | 0 | 1.1 |
| $\frac{10}{50}$ | 15 | 1.3 |
| $\frac{20}{50}$ | 22 | 1.4 |
| $\frac{50}{50}$ | 30 | 1.5 |
| $\frac{100}{50}$ | 36 | 1.6 |
| $\frac{200}{50}$ | 44 | 1.7 |
| $\frac{250}{50}$ | 46 | 1.75 |
| $\frac{300}{50}$ | 47.5 | 1.77 |
| $\frac{400}{50}$ | 50 | 1.9 |
| $\frac{2000}{50}$ | $SiO_2$ | 8.0 |

The transistor of the invention has high impurity concentration and low sheet resistance such as 0.1 Ω in the base, which results in high current gain and high cut off frequency such as 1 GHz. The difference in thermal expansion coefficients of the different layers is negligible.

Figure 6:
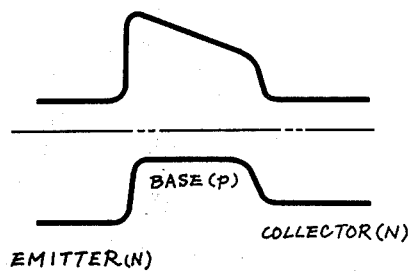
FIG. 6 illustrates the band gap characteristic of a second embodiment of the invention.

FIGS. 6 and 7A through 7D illustrate a second embodiment of the invention as applied to a drift base transistor having a high frequency characteristic. A drift base transistor having a base in which a drift field for minority carriers is caused by the gradient of impurity concentration is known. In this embodiment the drift field (potential) is caused by the gradient of the band gap which is wider at the emitter side as shown in FIG. 6. In FIG. 6, the first portion of the curve to the left represents the band gap of an NPN transistor emitter, and it is noted that this portion of an NPN transistor emitter, and it is noted that this portion of the band gap is flat. The next or center portion of the curve illustrates the band gap in the base and it is to be noted that the gradient of the band gap is wider adjacent the emitter than it is adjacent the right side which joins the collector. Thus in the base of the transistor illustrated in FIG. 6 electrons will tend to go down and holes will tend to go up. The more oxygen, the wider the band gap.

FIGS. 7A through 7D illustrate the method for constructing the second embodiment. A silicon substrate 23 has an N+ type body portion 21 and an N type epitaxial layer 22. A polycrystalline or amorphous silicon layer 24 is formed on the epitaxial layer 22. The layer 24 contains boron or oxygen and is formed by chemical vapor deposition. The oxygen doping increases toward the surface within the range from 0 to 50 atomic percent. The boron doping increases toward the surface also so as to compensate the decreasing of its activation under the existence of oxygen. A polycrystalline or amorphous silicon layer 25 containing phosphor and uniformly doped oxygen is deposited on the layer 24 continuously as shown in FIG. 7A. The layer 24 will be a base and the layer 25 will be the emitter.

The layers 24 and 25 are selectively etched by applying wax over the portion remaining in FIG. 7B to leave an emitter-base junction Je as shown in FIG. 7B.

The layer 24 and the substrate 22 are selectively etched by using wax 26 to leave a collector-base junction Jc as shown in FIG. 7C. This transistor is a mesa type transistor.

A passivating layer 27 is deposited as shown in FIG. 7D. The layer 27 comprises a polycrystalline or amorphous silicon layer 28 containing oxygen and a polycrystalline or amorphous silicon containing nitrogen or silicon dioxide layer 29 which is formed over the layer 28. Emitter and base electrodes 32 and 33 are deposited as shown in FIG. 7D on the emitter and base, respectively. These layers are continuously formed by chemical vapor deposition by using the apparatus shown in FIG. 5. A nitrogen source ($NH_3$) 31 is supplied to the reactor through the valve 30 when the layer 29 is nitrogen doped polycrystalline or amorphous silicon.

The layer 28 contains oxygen in the range of 2 to 45 atomic percent, and preferably in the range of 14 to 35 atomic percent. The main silicon grain size if 50 to 1000 A.

Figure 8:
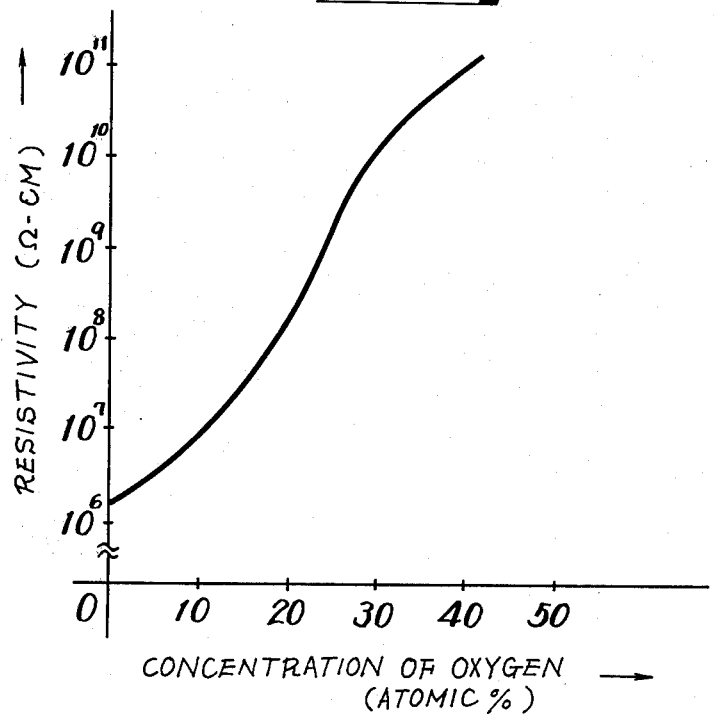
FIG. 8 is a plot of oxygen concentration in silicon versus the resistivity characteristic.

FIG. 8 illustrates the oxygen doping versus the resistivity of the layer 28. The main grain size is 200 to 300 A. As described in application, Ser. No. 561,532, filed March 24, 1975, entitled "Semiconductor Device", in which the inventors are Matsushita, Hayashi, Aoki, Yamoto and Kawana, which application is assigned to the same assignee as the present invention, the layer 28 has a good passivating property. If the layer 29 is nitrogen doped polycrystalline or an amorphous layer it will contain nitrogen of more than 10 atomic percent. As described in patent application, Ser. No. 624,889, filed Oct. 22, 1975, and assigned to the same assignee as the present application, such layer has a water-protecting property.

Figure 9:
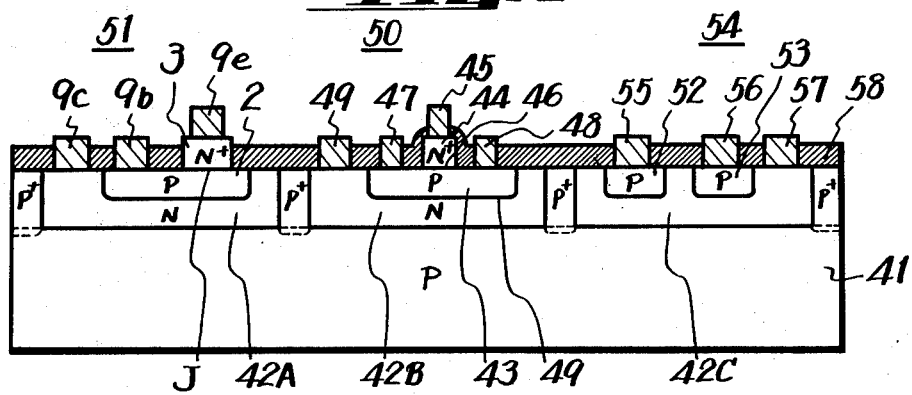
FIG. 9 ilustrates a third embodiment of the invention.

FIG. 9 illustrates a third embodiment of the invention applied to a junction type field effect transistor in which a gate junction is a hetero junction. Three N type island regions 42A, 42B and 42C are formed on a P type silicon substrate 41. A P type channel region 43 is formed in the island region 42B. A gate 44 of N type and oxygen doped amorphous or polycrystalline silicon is deposited on the channel region 43 to form a gate junction 46. Gate, source, drain and lower gate electrodes 45, 47, 48 and 49 are deposited as shown. The field effect transistor 50 has a high input impedance.

There is a wide gap emitter transistor 51 having an emitter hetero junction J formed in the island 42A. There is a lateral transistor 54 having an emitter 52 and a collector 53 in the island 42C.

Figure 10:
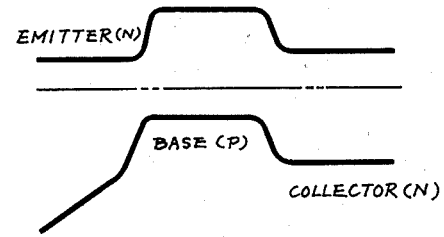
FIG. 10 illustrates the band gap energy distribution for an embodiment.

FIG. 10 illustrates the band gap structure for a fourth embodiment of the invention applied to a bipolar transistor having an emitter of oxygen doped polycrystalline or amorphous silicon. The oxygen concentration in the emitter increases toward the surface (opposite of the base) by a method described in the second embodiment so that the band gap energy in the emitter increases toward the surface as shown in the FIG. 10 band gap structure. It should be realized that the emitter is illustrated in the left portion of the curve in FIG. 10, and it is noted that the emitter curve slants generally upwardly toward the right. This provides a potential or a field to force back minority carriers injected from the base into the emitter and thus the transistor has a high emitter efficiency or a high current gain $h_{FE}$. In the embodiment of FIG. 10, the only difference between it and the embodiment illustrated in FIG. 6 is that the oxygen doped polycrystalline concentration is in the emitter rather than the base and this inhibits holes from going to the emitter and the gradient emitter resists hole injection from the base.

The invention can also be applied to a transistor which has a collector of polycrystalline or amorphous silicon to form a hetero collector-base junction and in such embodiment the third portion of the curve in FIGS. 10 and 6 would be slanted since this third portion represents the collector band gap structure.

Although this invention has been described with respect to preferred embodiments, it is not to be so limited as changes and modifications can be made which are within the full intended scope, as defined by the appended claims.

We claim as our invention:

1. A semiconductor device comprising a semiconductor region of a predetermined conductivity type, a polycrystalline or amorphous silicon layer containing oxygen and of a predetermined conductivity type on said region and forming a hetero junction therewith, and means for supplying an electrical current through said junction.

2. A semiconductor device according to claim 1, in which the oxygen concentration in said layer is substantially uniform.

3. A semiconductor device according to claim 1, in which the oxygen concentration in said layer is gradually varied as a function of thickness.

4. A semiconductor device comprising:
   a substrate of a first conductivity type;
   a first region of a second conductivity type formed in said substrate on a major surface thereof;
   a first polycrystalline or amorphous silicon layer containing oxygen and of said first conductivity type formed on selected regions of said first region; and
   electrodes formed on said substrate, said region and layer.

5. A semiconductor device according to claim 4, including a second polycrystalline or amorphous silicon layer without oxygen and of said first conductivity type formed on said first layer and said electrode is on said second layer.

6. A semiconductor device according to claim 1 including a layer of silicon dioxide formed on said region and said layer.

7. A semiconductor device according to claim 1, wherein the oxygen doping in said layer is such that the band gap is greater than said region by more than 0.2 eV.

8. A semiconductor device according to claim 1, wherein the oxygen concentration in said layer is in the range of 15 to 50 atomic percent.

9. A semiconductor device comprising a substrate of a first conductivity type, a first polycrystalline or amorphous silicon layer containing oxygen and of a second conductivity type formed on said substrate, a second polycrystalline or amorphous silicon layer containing oxygen and of the first conductivity type formed on said first layer, and electrodes formed on said substrate, said first and second layers.

* * * * *